US006489799B1

(12) United States Patent
Murakami

(10) Patent No.: US 6,489,799 B1
(45) Date of Patent: Dec. 3, 2002

(54) INTEGRATED CIRCUIT DEVICE HAVING PROCESS PARAMETER MEASURING CIRCUIT

(75) Inventor: Masaru Murakami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/559,064

(22) Filed: Apr. 28, 2000

(30) Foreign Application Priority Data

Apr. 30, 1999 (JP) .......................................... 11-124855

(51) Int. Cl.[7] .............................................. G01R 31/26
(52) U.S. Cl. ..................... 324/765; 324/158.1; 324/769; 324/763
(58) Field of Search ............................. 324/765, 158.1, 324/769, 73.1, 763; 357/23.4; 257/48; 438/17, 18, 19

(56) References Cited

U.S. PATENT DOCUMENTS 4,931,844 A * 6/1990 Zommer .................... 357/23.4

5,949,090 A * 9/1999 Iwasa et al. .................... 257/48

FOREIGN PATENT DOCUMENTS

EP        0430372 A1 * 6/1991 ........... G01R/31/28
JP        6-138189        5/1994
JP        10-090356       4/1998

* cited by examiner

Primary Examiner—Michael Sherry
Assistant Examiner—Jimmy Nguyen
(74) Attorney, Agent, or Firm—McGinn & Gibb, PLLC

(57) ABSTRACT

External connection terminals A to D of an integrated circuit are connected to each terminal of elements 1 to 5 to be measured for a process parameter using interconnections. Among the interconnections, one to connect the base of a bipolar transistor 1 and external connection terminal B for example is provided with a switch 6. A terminal of a particular element and an external connection terminal are connected by turning on of the switch 6. Thus, a process parameter of the bipolar transistor 1 is measured using the external terminals to which each terminal of the bipolar transistor is connected.

22 Claims, 2 Drawing Sheets

US 6,489,799 B1

INTEGRATED CIRCUIT DEVICE HAVING PROCESS PARAMETER MEASURING CIRCUIT

BACKGROUND OF THE INVENTION

1. Field of the Invention

The present invention relates to an integrated circuit device having a process parameter measuring circuit to evaluate the characteristic of elements formed in a semiconductor fabrication process, and more particularly, to an integrated circuit device having a process parameter measuring circuit used for in-process evaluation and permitting the characteristic of finished elements after assembly to be evaluated.

2. Description of the Related Art

To trial-manufacture a device element, there has been a conventional semiconductor device having a TEG (Test Element Group) portion provided separately from the internal circuits in the integrated circuit to perform functions essential to the semiconductor device and used only for measuring electrical characteristics. The TEG portion is a circuit for testing which is used only for measuring electrical characteristics. A semiconductor device provided with this TEG portion is disclosed in Japanese Patent Laid-Open Publication No. Hei 6-138189 (conventional device 1). FIG. 1 is a plan view of the semiconductor device disclosed in Japanese Patent Laid-Open Publication No. Hei 6-138189.

In this conventional technique, for an internal circuit 19 and a TEG portion 20, there are provided a connection selecting circuit 30 including field effect transistors 21 to 28 and an inverter 29, and an input terminal 31 for a selecting signal to input a control signal. An input terminal 32 to input an operation signal of the internal circuit 19 and an output terminal 33 to output the operation result are also used in common as an input terminal for a measurement signal to the TEG portion 20 and an output terminal to output a measurement result from the TEG portion 20. More specifically, depending upon whether a selecting signal input to the input terminal 31 is at an H level or an L level, the input terminal 32 and the output terminal 33 are selectively connected to the internal circuit 19 or the TEG portion 20. Thus, a signal can be transmitted/received to/from the internal circuit 19 or the TEG portion 20 without providing respective separate terminals for the internal circuit 19 and the TEG portion 20. Therefore, one input terminal and one output terminal for one of the internal circuit 19 and the TEG portion 20 can be omitted. Thus, the total number of terminals can be reduced.

Meanwhile, in the process of fabricating a semiconductor integrated circuit device, a check transistor is provided on a wafer, and process parameters including, for example, the DC current amplification factor hFE and threshold voltage Vt of the check transistor and the resistance of a polysilicon film forming an electrode are measured. Then, these measurement values are used to examine whether or not desired elements are formed.

Such a conventional check transistor is generally provided independently from other circuits and external connection terminals, using an unoccupied space on the wafer. FIG. 2 is a circuit diagram of this conventional process parameter measuring element (conventional device 2). As shown in FIG. 2, a bipolar transistor 1, an n-channel MOS (Metal Oxide Semiconductor) transistor 2, a p-channel MOS transistor 3, a capacitor 4 and a resistor 5 are connected with dedicated terminals E to Q, respectively, and using these terminals E to Q, the characteristic of each element is measured. These terminals E to Q are independent from the other circuits and bonding pads, and process parameters of each element can be measured using these terminals only in a wafer (pellet) state.

In recent years, there has been a demand for smaller and more densely integrated semiconductor integrated circuit devices. According to conventional device 1, the total number of terminals can be reduced, but the TEG portion 20 only for measuring electrical characteristics must be provided on the substrate separately from the internal circuit 19. This disadvantage impedes the size of the device from being further reduced.

According to conventional device 2, the check transistor operates together with the internal circuit in a normal operation state. The check transistor is however formed independently from the other circuits and external connection terminals. As a result, in order to measure the process parameters, a dedicated probe (terminal) should be used in a step separate from the sorting-out step. Also, in recent years, as the diffusion technique has developed, the size of each element has been gradually reduced. There exists a technical limit to the method of measuring process parameters by contacting the probe to the check transistor.

Note that a pad may be provided to allow the probe to abut upon the check transistor. The method is however against the trend of reduced chip size and higher density integration, and a certain area on the substrate could be wasted.

Furthermore, a main reason for measuring the values of process parameters after the assembly process is the necessity of analyzing defective products. In general, the defective product analysis must be quickly performed. However, in order to know the process parameter values after assembly, the upper part of a sample must be opened for measuring. This method not only requires time for opening the sample, but also the elements could be destroyed at the time of thus opening the sample.

SUMMARY OF THE INVENTION

It is an object of the present invention to provide an integrated circuit device having a process parameter measuring circuit which ensures measuring of process parameters in sorting-out step between mass products or the like, regardless of the chip size (element size) or regardless of whether the measurement takes place before or after the process of assembly.

According to one aspect of the present invention, an integrated circuit device having a process parameter measuring circuit comprises an integrated circuit, an element to be measured for a process parameter, external connection terminals for connecting said integrated circuit and an external circuit, interconnections for connecting terminals of said element and said external connection terminals, a control switch provided to the interconnection connected to the terminal of the element which control the on/off of the element, and a control circuit for controlling the on/off of the switch, said control circuit turning on said switch to measure a process parameter of said element using said external connection terminals and turning off said switch to disconnect said element from said external connection terminals.

According to another aspect of the invention, an integrated circuit device comprises an integrated circuit, a plurality of elements to be measured for process parameters, the element being the same type or the different type, external connection terminals for connecting said integrated circuit and an external circuit, interconnections for connecting terminals of said elements and said external connection terminals, a plurality of control switches provided to the interconnections connected to the terminals of the elements which control the on/off of the elements, and a control circuit for controlling the on/off of the switches, said control circuit turning on said switches to measure process parameters of said elements using said external connection terminals and turning off said switches to disconnect said elements from said external connection terminals.

According to the present invention, the control circuit turns on the control switch, so that the process parameter of the particular element can be measured using the external connection terminals. After the measurement, the control switches are all turned off, and then these terminals of the element can be disconnected from the external connection terminals.

According to the present invention, the external connection terminals are bonding pads in a wafer state before assembly.

Said element is for example a bipolar transistor. In this case, the transistor has its emitter connected to a first terminal of said external connection terminals, its base connected to a second terminal of said external connection terminals, and its collector connected to a third terminal of said external connection terminals, and said control switch is provided between the base and the second terminal. Thus, the control switch provided at the second external connection terminal can be turned on to measure parameters such as the DC current amplification factor hFE and base-emitter voltage $V_{BE}$, using the first to third external connection terminals.

Furthermore, said element is for example an n-channel MOS transistor. In this case, the transistor has its source connected to the first terminal of said external connection terminals, its gate connected to the second terminal of said external connection terminals, and its drain connected to the third terminal of said external connection terminals, and said control switch is provided between the gate and the second terminal. Furthermore, said element is for example a p-channel MOS transistor. In this case, the transistor has its drain connected to the first terminal of said external connection terminals, its gate connected to the second terminal of said external connection terminals, and its source connected to the third terminal of said external connection terminals, and said control switch is provided between the gate and the second terminal. Thus, the control switch provided at the second external connection terminal can be turned on to measure a parameter such as threshold voltage using the first to third external connection terminals.

Said element is for example a capacitor. In this case, the capacitor has its one terminal connected to the first terminal of said external connection terminals, and the other terminal connected to the second terminal of said external connection terminals, and said control switch is provided between the other terminal and the second terminal. Thus, the control switch provided at the second external connection terminal can be turned on to measure a parameter such as a capacitance value using the first and second external connection terminals.

Furthermore, said element is for example a resistor. In this case, one of the terminals of said resistor is connected to one of said external connection terminals through said control switches. Thus, the control switch provided at one of said external connection terminals can be turned on to measure a parameter such as a resistance value using the first and second external connection terminals.

The nature, principle, and utility of the invention will become more apparent from the following detailed description when read in conjunction with the accompanying drawings.

DETAILED DESCRIPTION OF THE PREFERRED EMBODIMENTS

Figure 1:
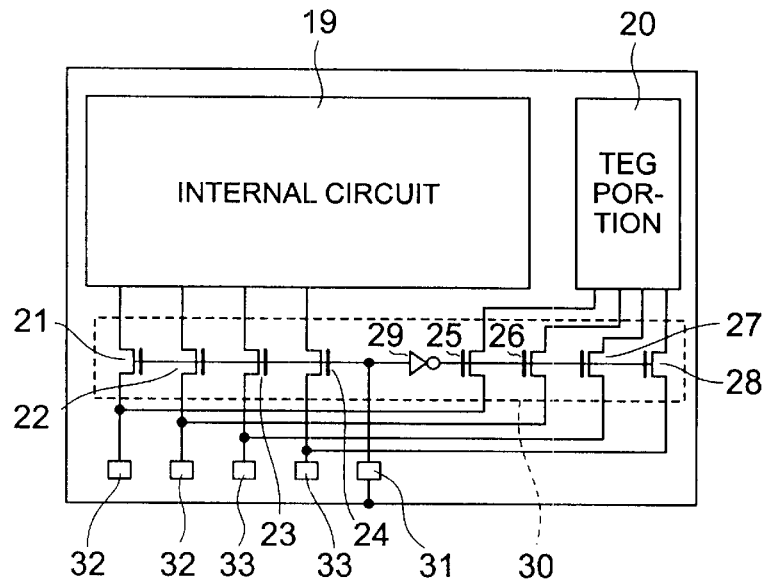
FIG. 1 is a plan view of a semiconductor device disclosed in Japanese Patent Laid-Open Publication No. Hei 6-138189.
Figure 2:
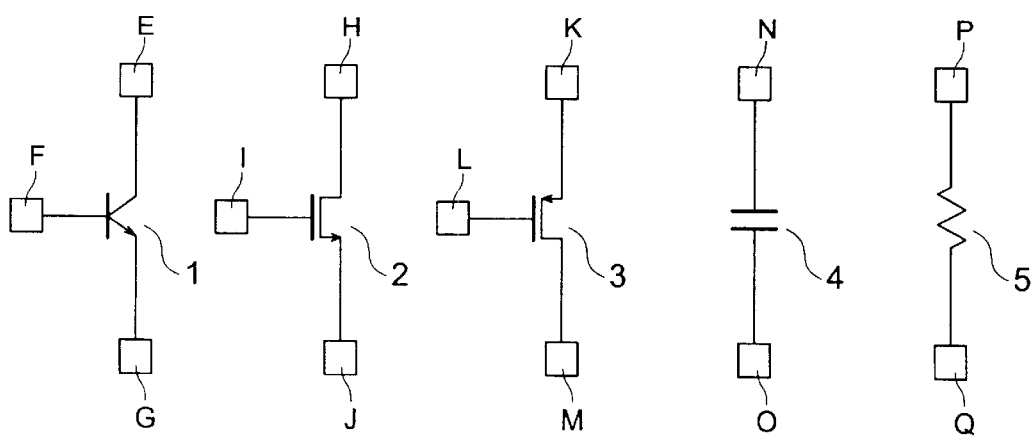
FIG. 2 is a circuit diagram showing a conventional process parameter measuring element.
Figure 3:
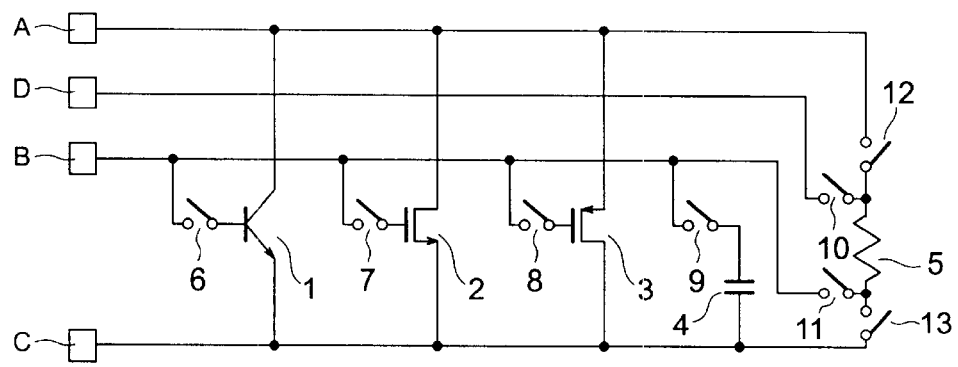
FIG. 3 is a circuit diagram showing an integrated circuit device having a process parameter measuring circuit according to a first embodiment of the present invention.

Embodiments of the present invention will be now described in detail in conjunction with the accompanying drawings. FIG. 3 is a circuit diagram of an integrated circuit device having a process parameter measuring circuit according to a first embodiment of the present invention.

According to the first embodiment, as elements whose process parameters are to be measured, a bipolar transistor 1, an n-channel MOS transistor 2, a p-channel MOS transistor 3, a capacitor 4 and a resistor 5 are provided. These elements are provided with external connection terminals A to D as external connection terminals for the integrated circuit device. The external connection terminals A to D are bonding pads in the state of a wafer before assembly.

The external connection terminals B and D are in a high-impedance state at the start of measuring, while the external connection terminal C is connected to GND and the external connection terminal A is not connected (No-Connect) to all of the power supply and GND.

The bipolar transistor 1 has its collector connected to the external connection terminal A (a third terminal), its emitter connected to the external connection terminal C (a first terminal), and its base connected to the external connection terminal B (a second terminal) through a switch 6 (a control switch). The n-channel MOS transistor 2 has its drain connected to the external connection terminal A, its source connected to the external connection terminal C, and its gate connected to the external connection terminal B through a switch 7 (a control switch). The p-channel MOS transistor 3 has its drain connected to the external connection terminal C, its source connected to the external connection terminal A, and its gate connected to the external connection terminal B through a switch 8 (a control switch). The capacitor 4 has one terminal connected to the external connection terminal C, and the other terminal connected to the external connection terminal B through a switch 9 (a control switch). Furthermore, the resistor 5 has its one terminal connected to the external connection terminal D (a fourth terminal) through a switch 10. The one terminal of resistor 5 is also connected to the external connection terminal A through a switch 12. The other terminal of the resistor 5 is connected to the external connection terminal B through a switch 11 (a control switch). The terminal is also connected to the external connection terminal C through a switch 13. The switches 6–13 are for example MOS transistors, and the on/off of switches 6–13 are controlled by a control circuit (not shown).

Note that both terminals of the capacitor 4 may be connected to any of the interconnections, and both terminals of the resistor 5 need only be each connected to at least one interconnection.

The operation of the first embodiment thus configured will be now described. First, in FIG. 3, only the switch 6 is turned on from the state in which all the switches are off, and the base of bipolar transistor 1 is connected to the external connection terminal B. Thus, the external connection terminals A, B and C can be connected to the three terminals of bipolar transistor 1. Thus, using the external connection terminals A, B and C, process parameters such as the DC current amplification factor hFE and base-emitter voltage $V_{BE}$ are measured.

Similarly, with only the switch 7 being turned on, the external connection terminals A, B and C are used to measure a process parameter of the n-channel MOS transistor 2 such as threshold voltage Vtn. With only the switch 8 being turned on, the external connection terminals A, B and C are used to measure the threshold voltage Vtp or the like of the p-channel MOS transistor 3.

With only the switch 9 being turned on, the external connection terminals B and C are used to measure the capacitance value of the capacitor 4.

Furthermore, with the switches 12 and 13 being turned off, the resistor 5 is brought into a state independent or disconnect from the external connection terminals A and C. Then, only the switches 10 and 11 are turned on. The external connection terminals B and D are used to measure the resistance value of the resistor 5.

Note that as an external connection terminal used for measuring the resistance value of this resistor 5, the external connection terminal A may be selected with the switch 12 being turned on, or the external connection terminal C may be selected with the switch 13 being turned on.

Meanwhile, when all the switches are turned off, each element used for measurement is independent from any of the external connection terminals A to D. Thus, the external connection terminals A to D may be used as a normal external connection terminal to connect an internal circuit in the integrated circuit device and an external circuit.

Note that a specific method of measuring each of process parameters in the above description may be a commonly employed method, and the description is not provided.

In this embodiment, four usual pins (bonding pads in a wafer state), which are the external connection terminals of the integrated circuit, are used to measure process parameters. More specifically, each terminal of elements to be measured for process parameters (which exist on the chip in the conventional configuration independently) is connected to the external connection terminals of the integrated circuit through the switches, the on/off of which is controlled. Thus, the elements to be measured for a particular process parameter and an external connection terminal can be connected. Process parameters of the integrated circuit can therefore be measured using the generally used external connection terminals. Accordingly, process parameters can be measured according to the same method not only in the wafer discrimination step but also in the discrimination step after assembly.

Furthermore, a usual pin, an external connection terminal of the integrated circuit is used for measurement rather than contacting a measuring probe against a terminal to be measured in the integrated circuit. Therefore, how much smaller the size of each element may become by development of the diffusion technique, process parameters can be measured.

In addition, in contrast to the conventional case where a check transistor is provided on a basis of one per several samples, the parameter measuring circuit of the present invention can be incorporated in all the integrated circuits as a part of other functional circuits. Therefore, process parameters can be measured in all the integrated circuits. Furthermore, if the size of each element is reduced, highly precise measurement is ensured regardless of the kind of the element.

Also, probes (terminals) dedicated for measuring are not necessary unlike the conventional case, which can reduce the cost of measurement.

Figure 4:
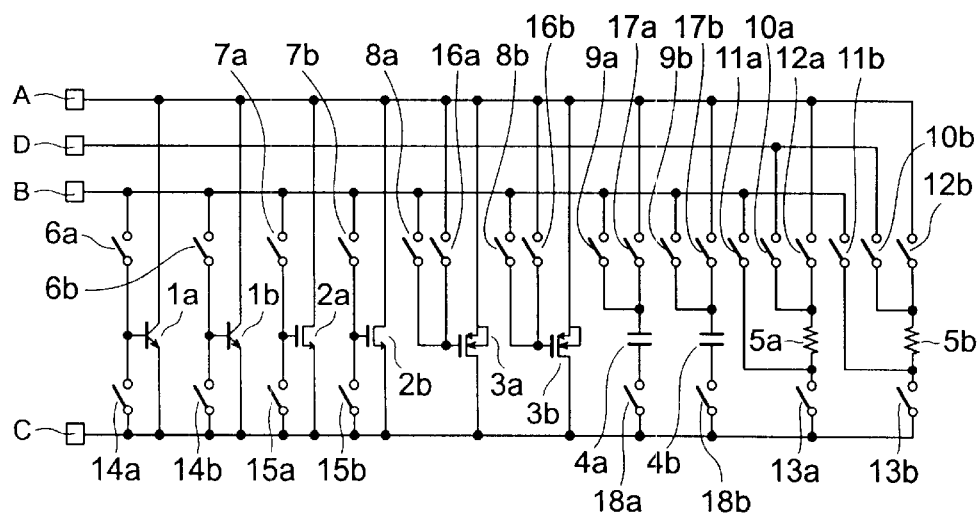
FIG. 4 is a circuit diagram showing an integrated circuit device having a process parameter circuit according to a second embodiment of the present invention.

A second embodiment of the present invention will be now described. FIG. 4 is a circuit diagram showing a process parameter measuring circuit according to the second embodiment of the present invention. According to the second embodiment, as elements to be measured for process parameters, the elements to be measured in the first embodiment shown in FIG. 3 are provided in pairs.

The external connection terminals B and D are in a high-impedance state at the start of measuring, while the external connection terminal C is connected to GND and the external connection terminal A is not connected (No-Connect) to the power supply or GND.

First, bipolar transistors 1a and 1b have their collectors connected to the external connection terminal A (a third terminal), their emitters connected to the external connection terminal C (a first terminal) and their bases connected to the external connection terminal B (a second terminal) through switches 6a and 6b (control switches), respectively, the same as that in the first embodiment. Furthermore, the bases of the bipolar transistors 1a and 1b are connected to their emitters through switches 14a and 14b, respectively.

N-channel MOS transistors 2a, 2b and p-channel MOS transistors 3a, 3b have their drains connected to the external connection terminals A and C, respectively, their sources connected to the external connection terminals C and A, respectively, and their gates connected to the external connection terminal B through switches 7a, 7b (control switches) and 8a, 8b (control switches), respectively. The gates of the n-channel MOS transistors 2a and 2b are connected to their sources through switches 15a and 15b, respectively, and the gates of the p-channel MOS transistors 3a and 3b are connected to their sources through switches 16a and 16b, respectively. Similarly to the first embodiment, capacitors 4a and 4b have their one terminals connected to the external connection terminal B through switches 9a and 9b (control switches), respectively. The one terminals of the capacitors 4a and 4b are further connected to the external connection terminal A through switches 17a and 17b, respectively. The other terminals of the capacitors 4a and 4b are connected to the external connection terminal C through switches 18a and 18b, respectively. Furthermore, the resistors 5a, 5b have their one terminals connected to the external connection terminal D (a fourth terminal) through switches 10a, 10b, respectively. The one terminals of resistors 5a, 5b are also connected to the external connection terminal A through switches 12a, 12b, respectively. The other terminals of the resistors 5s, 5b are connected to the external connection terminal B through switches 11a, 11b (control switches), respectively. The other terminals of the resistors 5a, 5b are also connected to the external connection terminal C through switches 13a, 13b, respectively.

In the integrated circuit device having this configuration according to the second embodiment, the bipolar transistors 1a and 1b have their bases and emitters connected through switches 14a and 14b. The n-channel transistors 2a and 2b have their gates and sources connected through switches 15a and 15b. Further, the p-channel transistors 3a and 3b similarly have their gates and sources connected through switches 16a and 16b. Therefore, in addition to the effect of the first embodiment, each of the switches 14a to 16b may be turned on to connect the base-emitter regions of the bipolar transistors 1a, 1b, so that the operation of the bipolar transistors can be completely stopped. Furthermore, when the switches 15a, 15b and 16a, 16b are turned on, the gate-source regions of the p-channel MOS transistors 2a, 2b and the n-channel MOS transistors 3a, 3b can be connected, so that the operation of the MOS transistors can be completely stopped. In addition, all the interconnections to connect the capacitors 4a, 4b and the resistors 5a, 5b are each provided with a switch, the capacitors 4a, 4b and the resistors 5a, 5b can be completely independent from the external connection terminals A to D by turning off all these switches. As a result the process parameters can be more accurately measured than the circuit according to the first embodiment shown in FIG. 3.

Furthermore, the number of such elements can be increased not only by providing elements in pairs as shown in FIG. 4 but also as required and the number is not limited.

In addition, not only the individual values of elements but also the relativity (relative values) of elements of the same kind can be obtained.

Furthermore, in this embodiment, interconnections to connect the external connection terminal A through switches 17a and 17b are provided at least one terminal of the capacitors 4a, 4b, and therefore a terminal used for measuring the capacitance values of the capacitors 4a, 4b may be selected between the external connection terminals A and B.

Note that a switch may be provided to all the interconnections to connect terminals of each element and thus the external connection terminals A to D and each element can be completely independent from one another by turning off all the switches after measurement.

Furthermore, a probe (terminal) dedicated for measurement is not necessary unlike the conventional case, and therefore the manufacturing cost can be reduced.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An integrated circuit device, comprising:
    an integrated circuit, said integrated circuit comprising at least one element serving two roles, a first of said two roles being a functional component in said integrated circuit, a second of said two roles being an element to be measured for a process parameter;
    external connection terminals for interconnecting said integrated circuit and a circuit external to said integrated circuit;
    interconnections for interconnecting one or more terminals of said at least one element and one or more said external connection terminals;
    at least one control switch provided in said interconnections connected to said terminals of said element, said at least one control switch providing a switching between said first role and said second role such that at least one process parameter of said element can be tested using predetermined ones of said external connection terminals.

2. The integrated circuit device according to claim 1, wherein said external connection terminals are bonding pads in a wafer state.

3. The integrated circuit device according to claim 2, wherein
    said first external connection terminal connected to ground, said second external connection terminal attains a high-impedance state when said control switch is in an off state, and said third external connection terminal is not connected to any of a power supply and GND.

4. The integrated circuit device according to claim 1, wherein
    said element is a bipolar transistor, having an emitter connected to a first terminal of said external connection terminals, a base connected to a second terminal of said external connection terminals, and a collector connected to a third terminal of said external connection terminals, and said control switch is provided between the base and the second terminal.

5. The integrated circuit device according to claim 4, wherein
    the base is also connected to the emitter through other switch.

6. The integrated circuit device according to claim 1, wherein
    said element is an n-channel MOS transistor, having a source connected to a first terminal of said external connection terminals, a gate connected to a second terminal of said external connection terminals, and a drain connected to a third terminal of said external connection terminals, and said control switch is provided between the gate and the second terminal.

7. The integrated circuit device according to claim 6, wherein
    the gate is also connected to the source through other switch.

8. The integrated circuit device according to claim 1, wherein
    said element is a p-channel MOS transistor, having a drain connected to a first terminal of said external connection terminals, a gate connected to a second terminal of said external connection terminals, and a source connected to a third terminal of said external connection terminals, and said control switch is provided between the gate and the second terminal.

9. The integrated circuit device according to claim 8, wherein
    the gate is also connected to the source through other switch.

10. The integrated circuit device according to claim 1, wherein
    said element is a capacitor, having one terminal connected to a first terminal of said external connection terminals, and the other terminal connected to a second terminal of said external connection terminals, and said control switch is provided between the other terminal and the second terminal.

11. The integrated circuit device according to claim 10, further comprising another switch connected between said first terminal and said other terminal of said capacitor.

12. The integrated circuit device according to claim 11, further comprising still other switch connected between a third terminal of said external connection terminals and said one terminal of said capacitor.

13. The integrated circuit device according to claim 1, wherein
    said element is a resistor, one of the terminals of said resistor being connected to one of said external connection terminals through said control switch.

14. The integrated circuit device according to claim 13, further comprising another switch connected between other terminal of said resistor and the other terminal of said external connection terminals, which is not connected to said control switch.

15. The integrated circuit device according to claim 14, further comprising still other switch connected between the terminal of said resistor, which is connected to said control switch and still other terminal of said external connection terminals.

16. An integrated circuit device, comprising:
an integrated circuit, said integrated circuit including at least one element serving a plurality of roles, a first of said plurality of roles comprising a functional component in said integrated circuit, a second of said plurality of roles comprising an element used to measure a process parameter;
a plurality of elements to be used for measuring one or more process parameters, each said element being the same type or a different type and each said element being one of said at least one element serving said plurality of roles;
external connection terminals for connecting aid integrated circuit and a circuit external to said integrated circuit;
interconnections for respectively interconnecting one or more terminals of said elements and said external connection terminals; and
a plurality of control switches respectively provided to said interconnections connected to said one or more terminals of said elements, said control switches allowing said elements to be removed as components of said integrated circuit and used for said process parameter measurements by respectively connecting at least one of said elements to said external connection terminals.

17. The integrated circuit device according to claim 16, wherein
at least two elements of the same kind are connected in parallel.

18. The integrated circuit device according to claim 17, wherein
said elements of the same kind are bipolar transistors, each of said bipolar transistors having an emitter connected to a first terminal of said external connection terminals, a base connected to a second terminal of said external connection terminals, and a collector connected to a third terminal of said external connection terminals, and said control switch is provided between the base and the second terminal.

19. The integrated circuit device according to claim 17, wherein
said elements of the same kind are n-channel MOS transistors, each of said n-channel MOS transistors having a source connected to a first terminal of said external connection terminals, a gate connected to a second terminal of said external connection terminals, and a drain connected to a third terminal of said external connection terminals, and said control switch is provided between the gate and the second terminal.

20. The integrated circuit device according to claim 17, wherein
said elements of the same kind are p-channel MOS transistors, each of said p-channel MOS transistors having a drain connected to a first terminal of said external connection terminals, a gate connected to a second terminal of said external connection terminals, and a source connected to a third terminal of said external connection terminals, and said control switch is provided between the gate and the second terminal.

21. A method of measuring process parameters for an integrated circuit, said integrated circuit comprising a plurality of components on a substrate, said plurality of components interconnected to form a circuit performing a predetermined circuit function, said integrated circuit including at least one element serving a plurality of roles, a first of said plurality of roles comprising a functional component in said integrated circuit, a second of said plurality of roles comprising an element to be used to measure a process parameter, said integrated circuit further comprising a plurality of connection terminals to externally interface with said integrated circuit, said substrate further including at least one test switch unrelated to said predetermined circuit function, said at least one test switch being interconnected to a one of said plurality of circuit components in a manner to allow said one circuit component to be isolated from said circuit to allow a process parameter related to said component to be measured, said method comprising:
connecting said one circuit component to a test circuit external to said integrated circuit; and
measuring at least one process parameter.

22. The method of claim 21, wherein said isolated component is connected during said process parameter measurement to a predetermined one or ones of said plurality of connection terminals normally used for said external interface of said integrated circuit.

* * * * *